United States Patent
Suk et al.

(10) Patent No.: US 8,395,218 B2
(45) Date of Patent: Mar. 12, 2013

(54) GATE-ALL-AROUND TYPE SEMICONDUCTOR DEVICE AND METHOD OF MANUFACTURING THE SAME

(75) Inventors: Sung-Dae Suk, Seoul (KR); Dong-Won Kim, Seongnam-si (KR); Kyoung-Hwan Yeo, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 78 days.

(21) Appl. No.: 12/805,776

(22) Filed: Aug. 19, 2010

(65) Prior Publication Data
US 2010/0314604 A1 Dec. 16, 2010

Related U.S. Application Data

(62) Division of application No. 11/905,511, filed on Oct. 2, 2007, now Pat. No. 7,803,675.

(30) Foreign Application Priority Data

Oct. 2, 2006 (KR) .................. 10-2006-0097082

(51) Int. Cl.
*H01L 21/70* (2006.01)
(52) U.S. Cl. . 257/368; 257/347; 257/627; 257/E23.179; 257/E29.004
(58) Field of Classification Search .................. 257/347, 257/368, 627, E23.179, E29.004
See application file for complete search history.

(56) References Cited

U.S. PATENT DOCUMENTS

| | | |
|---|---|---|
| 6,855,606 B2 | 2/2005 | Chen et al. |
| 7,274,051 B2 | 9/2007 | Kim et al. |
| 7,427,788 B2 | 9/2008 | Li et al. |
| 7,482,206 B2 | 1/2009 | Baik et al. |
| 7,588,977 B2 | 9/2009 | Suk et al. |
| 7,642,578 B2 | 1/2010 | Lee et al. |
| 7,863,674 B2 * | 1/2011 | Yeo et al. ........... 257/329 |
| 2004/0262692 A1 | 12/2004 | Hareland et al. |
| 2005/0275010 A1 | 12/2005 | Chen et al. |
| 2006/0029887 A1 | 2/2006 | Oh et al. |
| 2006/0166456 A1 | 7/2006 | Fujiwara et al. |
| 2007/0287259 A1 | 12/2007 | Kavalieros et al. |
| 2008/0135949 A1 | 6/2008 | Lo et al. |
| 2008/0246021 A1 | 10/2008 | Suk et al. |
| 2009/0294864 A1 | 12/2009 | Suk et al. |

FOREIGN PATENT DOCUMENTS

| | | |
|---|---|---|
| KR | 10-0544324 | 1/2006 |
| KR | 10-2006-0037561 | 5/2006 |

* cited by examiner

*Primary Examiner* — Samuel Gebremariam
(74) *Attorney, Agent, or Firm* — Harness, Dickey & Pierce, P.L.C.

(57) ABSTRACT

The gate-all-around (GAA) type semiconductor device may include source/drain layers, a nanowire channel, a gate electrode and an insulation layer pattern. The source/drain layers may be disposed at a distance in a first direction on a semiconductor substrate. The nanowire channel may connect the source/drain layers. The gate electrode may extend in a second direction substantially perpendicular to the first direction. The gate electrode may have a height in a third direction substantially perpendicular to the first and second directions and may partially surround the nanowire channel. The insulation layer pattern may be formed between and around the source/drain layers on the semiconductor substrate and may cover the nanowire channel and a portion of the gate electrode. Thus, a size of the gate electrode may be reduced, and/or a gate induced drain leakage (GIDL) and/or a gate leakage current may be reduced.

16 Claims, 16 Drawing Sheets

GATE-ALL-AROUND TYPE SEMICONDUCTOR DEVICE AND METHOD OF MANUFACTURING THE SAME

PRIORITY STATEMENT

This application is a divisional of U.S. application Ser. No. 11/905,511 filed Oct. 2, 2007, which claims priority under 35 U.S.C. §119 to Korean Patent Application No. 2006-97082, filed on Oct. 2, 2006, in the Korean Patent Office, the entire contents each of which are incorporated herein by reference.

BACKGROUND

1. Field

Example embodiments relate to a semiconductor device and a method of manufacturing the same. More particularly, example embodiments relate to a gate-all-around (GAA) type semiconductor device and a method of manufacturing the same.

2. Description of Related Art

As an integration degree of semiconductor devices has increased, a size of a region for forming unit cells, e.g., a size of an active region has been reduced, and thus a channel length of a metal-oxide-semiconductor (MOS) transistor formed in the active region has been reduced. If the channel length of the MOS transistor is reduced, a short channel effect, e.g., an effect of a source/drain region on an electric field of a channel region, may be increased and a channel driving capability of a gate electrode may be deteriorated. Additionally, the source/drain region and the gate electrode may be closely disposed to each other so that a high electric field may be generated between the source/drain region and the gate electrode, and a gate induced drain leakage (GIDL) may be increased. Furthermore, a gate leakage current, e.g., a current flowing through the source/drain region due to the gate electrode, may be increased.

In order to solve the above problems, a gate-all-around (GAA) type MOS transistor, in which a channel region is surrounded by a gate electrode, has been developed. The GAA type MOS transistor may have a reduced short channel effect, because the channel region may be surrounded by the gate electrode so that an effect of the source/drain region on an electric field of the channel region may be reduced. However, as the gate electrode makes contact with the source/drain region at a broad area, solving the above problems of the high GIDL and the high gate leakage current may not be easy.

SUMMARY

Example embodiments provide a gate-all-around (GAA) type semiconductor device, in which a gate induced drain leakage (GIDL) and/or a gate leakage current may be reduced.

Example embodiments provide a method of manufacturing a GAA type semiconductor device, in which a GIDL and/or a gate leakage current may be reduced.

According to an example embodiment, there may be provided a GAA type semiconductor device. The GAA type semiconductor device may include source/drain layers, a nanowire channel, a gate electrode and an insulation layer pattern. The source/drain layers may be disposed at a distance in a first direction on a semiconductor substrate. The nanowire channel connects the source/drain layers. The gate electrode may extend in a second direction substantially perpendicular to the first direction. The gate electrode may have a height in a third direction substantially perpendicular to the first and second directions and may partially surround the nanowire channel. The insulation layer pattern may be formed between and around the source/drain layers on the semiconductor substrate and covers the nanowire channel and a portion of the gate electrode.

In an example embodiment, the semiconductor device may further include a sacrificial layer pattern formed between the semiconductor substrate and the source/drain layers.

In an example embodiment, the semiconductor substrate, the source/drain layers, and the sacrificial layer pattern may include single crystal silicon, doped single crystal silicon, silicon germanium, respectively.

In an example embodiment, the nanowire channel may have a circular cylindrical shape or an elliptic cylindrical shape extending along the first direction.

In an example embodiment, the gate electrode may include a metal, a metal nitride or polysilicon.

In an example embodiment, the gate electrode may include titanium nitride.

In an example embodiment, a plurality of active regions, each of which includes the nanowire channel and a pair of the source/drain layers connected to each other by the nanowire channel, may be formed on the semiconductor substrate.

In an example embodiment, the insulation layer pattern may serve as an isolation layer for isolating the active regions from one another.

According to another example embodiment, there is a method of manufacturing a gate-all-around (GAA) type semiconductor device. In the method of manufacturing the GAA type semiconductor device, a preliminary sacrificial layer pattern, a preliminary channel layer pattern and a mask pattern may be formed on a semiconductor substrate. The preliminary sacrificial layer pattern and the preliminary channel layer pattern may have a first width greater than a second width of the mask pattern. A first insulation layer may be formed on the semiconductor substrate to cover the mask pattern, the preliminary channel layer pattern and the preliminary sacrificial layer pattern. The first insulation layer may have a first opening exposing a portion of the mask pattern. A second opening may be formed by removing the exposed portion of the mask pattern. The second opening may expose a portion of the preliminary channel layer pattern. A sacrificial layer pattern and a channel layer pattern may be formed on the semiconductor substrate by removing the exposed portion of the preliminary channel layer pattern and a portion of the preliminary sacrificial layer pattern disposed under the exposed portion of the preliminary channel layer pattern. A third opening may be formed by partially removing the first insulation layer. The third opening may contain the channel layer pattern and the sacrificial layer pattern. The channel layer pattern may be transformed to a preliminary nanowire channel by removing the sacrificial layer pattern. A gate conductive layer may be formed on the semiconductor substrate to cover the third opening. The first insulation layer and the mask pattern may be removed. A gate electrode may be formed by partially removing the gate conductive layer to detach the gate electrode from the preliminary channel layer pattern. A second insulation layer may be formed on the semiconductor substrate to cover the gate electrode, the preliminary nanowire channel, the preliminary channel layer pattern and the preliminary sacrificial layer pattern. Impurities may be implanted into the preliminary channel layer pattern to convert the preliminary channel layer pattern and the preliminary nanowire channel into a source/drain layer and a nanowire channel, respectively.

In an example embodiment, the semiconductor substrate and the preliminary channel layer pattern may be formed using single crystal silicon, and the preliminary sacrificial layer pattern may be formed using silicon germanium.

In an example embodiment, the preliminary channel layer pattern and the preliminary sacrificial layer pattern may be formed by an epitaxial growth process.

In an example embodiment, prior to forming the gate conductive layer, the preliminary nanowire channel may be annealed.

In an example embodiment, the preliminary nanowire channel may be annealed at a temperature of about 800 to about 1000° C. at a pressure below about 10 Torr for about 100 to about 1000 seconds.

In an example embodiment, prior to implanting the impurities into the preliminary channel layer pattern, the second insulation layer may be partially removed until an upper face of the preliminary channel layer pattern may be exposed to form a second insulation layer pattern and expose an upper portion of the gate electrode. A third insulation layer may be formed on the preliminary channel layer pattern and the second insulation layer pattern to cover the upper portion of the gate electrode. The third insulation layer may be partially removed by an etch-back process to form a spacer on a sidewall of the gate electrode, a portion of the preliminary channel layer pattern and a portion of the second insulation layer pattern.

In an example embodiment, the second insulation layer may be removed until a top surface of the gate electrode may be exposed. A top surface of the second insulation layer and the top surface of the gate electrode may be planarized.

In an example embodiment, the gate electrode may be formed by a stripping process using polyacrylonitrile (PAN).

In an example embodiment, the sacrificial layer pattern and the channel layer pattern may be formed by a dry etching process.

In an example embodiment, the gate conductive layer may be formed using a metal, a metal nitride or polysilicon.

In an example embodiment, the gate electrode may be formed using titanium nitride.

In an example embodiment, in a gate-all-around (GAA) type semiconductor device having a nanowire channel, a size of a gate electrode may be reduced and an insulation layer pattern may be formed between the gate electrode and a source/drain layer. Thus, an area at which the gate electrode makes contact with the source/drain layer may be reduced so that a gate induced drain leakage (GIDL) may be reduced. Additionally, a gate leakage current may be reduced because a distance between the gate electrode and the source/drain layer may be increased. Furthermore, the gate electrode may have a size smaller than that of a conventional gate electrode so that the GAA type semiconductor device may be advantageous with respect to physical space requirements, and general integration.

BRIEF DESCRIPTION OF THE DRAWINGS

The above and other features and advantages of example embodiments will become more apparent by describing in detailed example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1A:
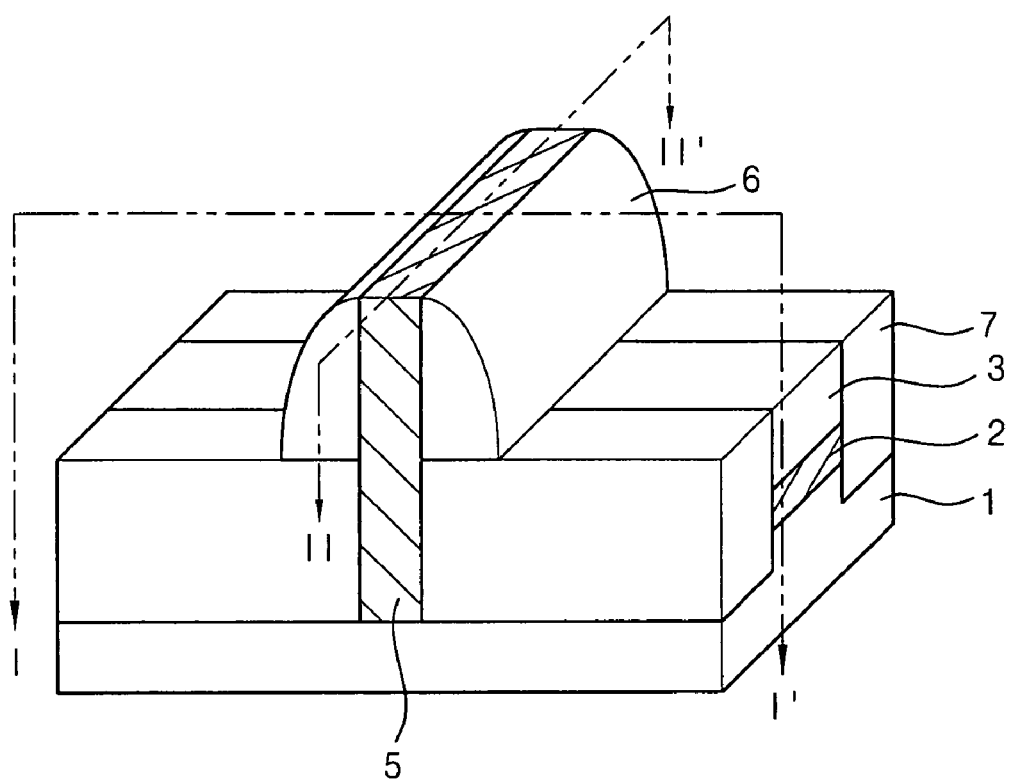
FIG. 1A is a perspective view illustrating a gate-all-around (GAA) type semiconductor device in accordance with an example embodiment.
Figure 1A:
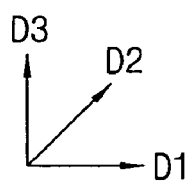

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are described more fully hereinafter with reference to the accompanying drawings. Example embodiments may, however, be embodied in many different forms and should not be construed as limited to the example embodiments set forth herein. Rather, these example embodiments are provided so that this disclosure will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
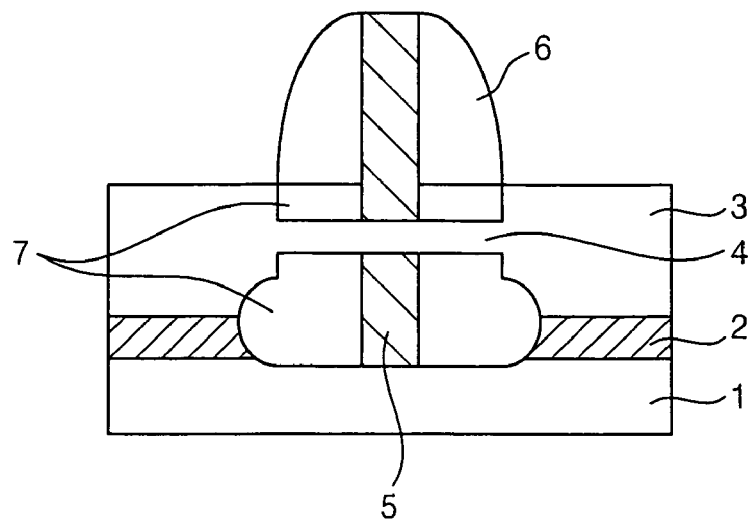
FIG. 1B is a cross-sectional view illustrating a GAA type semiconductor device taken along a line I-I' in FIG. 1.
Figure 1C:
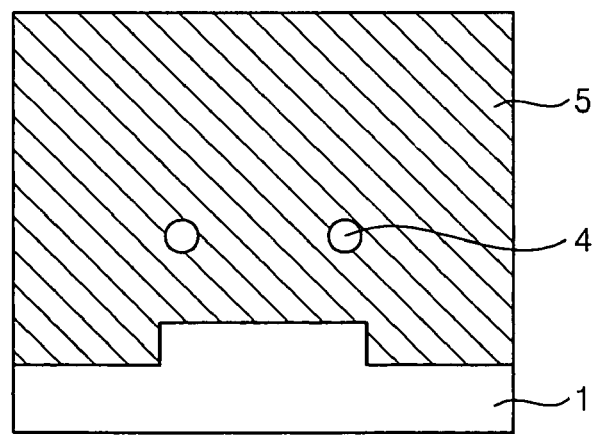
FIG. 1C is a cross-sectional view illustrating a GAA type semiconductor device taken along a line II-II' in FIG. 1.

FIG. 1A is a perspective view illustrating a gate-all-around (GAA) type semiconductor device in accordance with example embodiments, FIG. 1B is a cross-sectional view illustrating a GAA type semiconductor device taken along a line I-I' in FIG. 1, and FIG. 1C is a cross-sectional view illustrating a GAA type semiconductor device taken along a line II-II' in FIG. 1.

Referring to FIGS. 1A to 1C, a GAA type semiconductor device may include sacrificial layer patterns 2 formed on a semiconductor substrate 1, a source and drain layer 3 separated a predetermined distance apart from each other, a gate electrode 5 and an insulation layer pattern 7. A GAA type semiconductor device may further include a nanowire channel 4 formed between the source/drain layers 3 and a spacer 6.

The semiconductor substrate 1 may include silicon. In an example embodiment, the semiconductor substrate 1 may include single crystal silicon. A portion of the semiconductor substrate 1 may be protruded in a third direction D3, which may be substantially perpendicular to a plane, on which the semiconductor substrate 1 and the sacrificial layer patterns 2 may be formed.

The sacrificial layer patterns 2 may include a material having an etching selectivity with respect to the semiconductor substrate 1 and the source/drain layers 3. In an example embodiment, the sacrificial layer patterns 2 may include silicon germanium. The sacrificial layer patterns 2 may be formed from a sacrificial layer, which may form the nanowire channel 4. Alternatively, the sacrificial layer patterns 2 may not be formed.

The source/drain layers 3 may be formed on the sacrificial layer patterns 2. In an example embodiment, the source/drain layers 3 may include silicon doped with impurities.

The sacrificial layer patterns 2 and the source/drain layers 3 may be divided along a first direction D1 by the insulation layer pattern 7 that may be formed on the semiconductor substrate 1. That is, the sacrificial layer patterns 2 and the source/drain layers 3 may extend in the first direction D1 and may be divided by the insulation layer pattern 7 extending in a second direction D2 substantially perpendicular to the first direction D1.

The nanowire channel 4 may connect the source/drain layers 3 which may be divided by the insulation layer pattern 7. The nanowire channel 4 may have a bridge shape such as a circular cylindrical shape or an elliptic cylindrical shape having a lengthwise direction in parallel with the first direction D1. In an example embodiment, the nanowire channel 4 may include silicon doped with impurities.

A gate insulation layer (not shown) including silicon oxide may be further formed on the nanowire channel 4.

The gate electrode 5 may extend along the second direction D2 and may have a height extending along the third direction D3. The gate electrode 5 may be partially covered by the insulation layer pattern 7 and the gate electrode 5 may cover a central portion of the nanowire channel 4.

The gate electrode 5 may include a metal nitride such as titanium nitride, tantalum nitride, etc., a metal such as titanium, tantalum, etc., or polysilicon. In an example embodiment, the gate electrode 5 may include titanium nitride.

Unlike a conventional gate-all-around (GAA) type MOS transistor, a GAA type MOS transistor in accordance with example embodiments may include an insulation layer pattern 7 formed between a gate electrode 5 and source/drain layers 3 (depicted in FIG. 1B) so that an area in which the gate electrode 5 and the source/drain layers 3 may make contact with each other may be reduced. Thus, a gate induced drain leakage (GIDL) may be reduced. Additionally, a gate leakage current may be reduced because a distance between the gate electrode 5 and the source/drain layers 3 may be increased. Furthermore, the gate electrode 5 may have a size smaller than that of a conventional GAA MOS transistor, thereby having a greater integration degree. That is, the integration degree may be increased by reducing the size of the gate electrode 5 and the insulation layer pattern 7 partially covering the gate electrode 5.

A spacer 6 may be formed on a sidewall of the gate electrode 5, which may be protruded from the source/drain layers 3 and the insulation layer pattern 7. The spacer 6 covers the sidewall of the gate electrode 5, a portion of the source/drain layers 3 and a portion of the insulation layer pattern 7.

The spacer 6 may have a width in the first direction D1 greater than or substantially the same as a length of the nanowire channel 4. Thus, if impurities are doped into a single crystal silicon layer to form the source/drain layers 3, the impurities may not be directly doped into the nanowire channel 4, but may be indirectly doped into the nanowire channel 4 via the source/drain layers 3 so that the nanowire channel 4 may be prevented from being damaged.

The spacer 6 may include an oxide such as silicon oxide or a nitride such as silicon nitride. In an example embodiment, the spacer 6 may include silicon nitride.

The insulation layer pattern 7 may include an oxide such as silicon oxide, a high density plasma (HDP) oxide, etc. The insulation layer pattern 7 may divide the sacrificial layer patterns 2 and the source/drain layers 3 and may serve as an isolation layer. That is, if a plurality of active regions, each of which has the sacrificial layer patterns 2 and the nanowire channel 4, is formed in the semiconductor device, the insulation layer pattern 3 may electrically insulate each of the active regions from one another. Particularly, if the active regions extending in the first direction D1 are disposed in the second direction D2, the active regions may be divided by the insulation layer pattern 7.

Figure 2A:
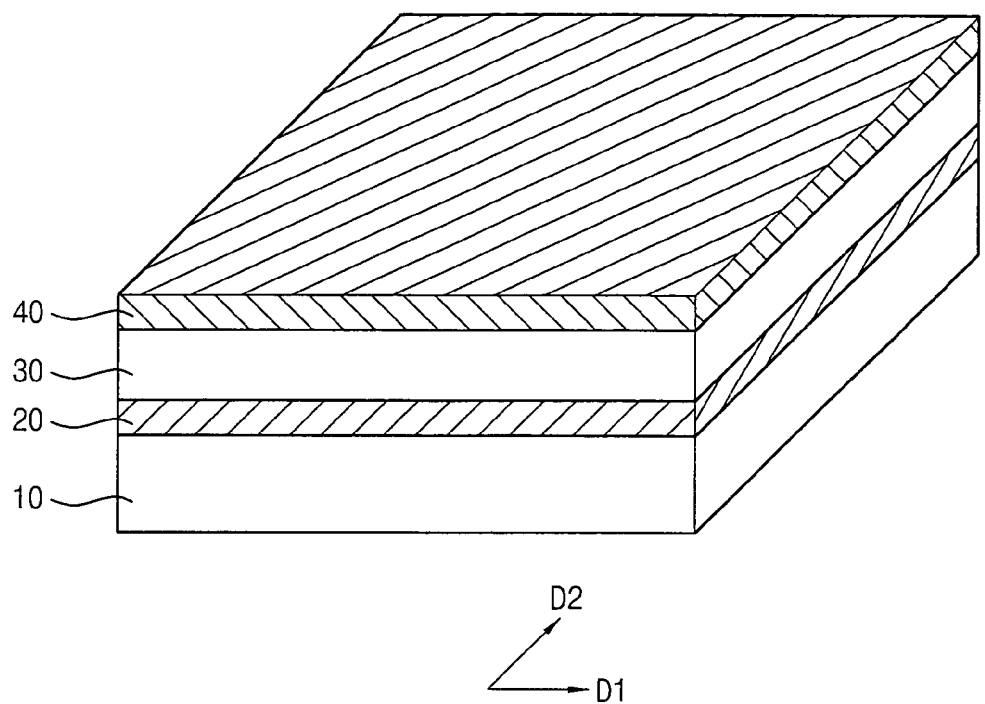
FIGS. 2A to 2T are perspective views illustrating a method of manufacturing a GAA type semiconductor device in accordance with example embodiments.
Figure 2B:
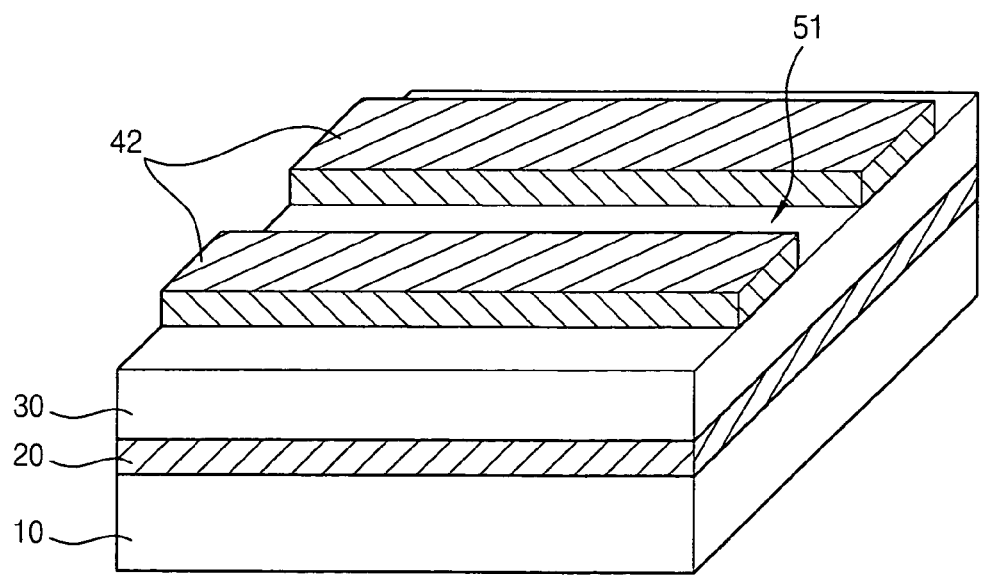
Figure 2C:
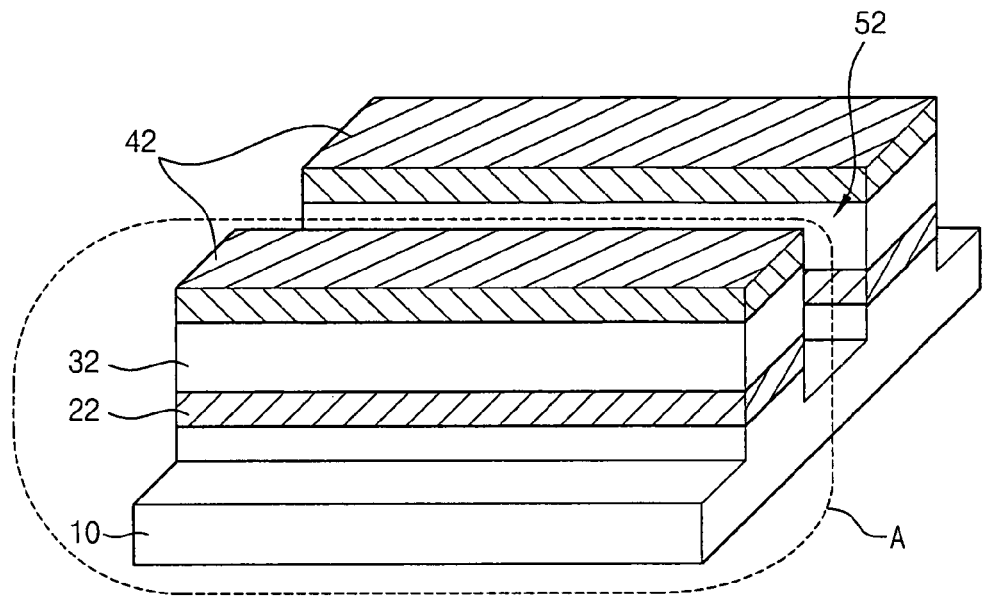
Figure 2D:
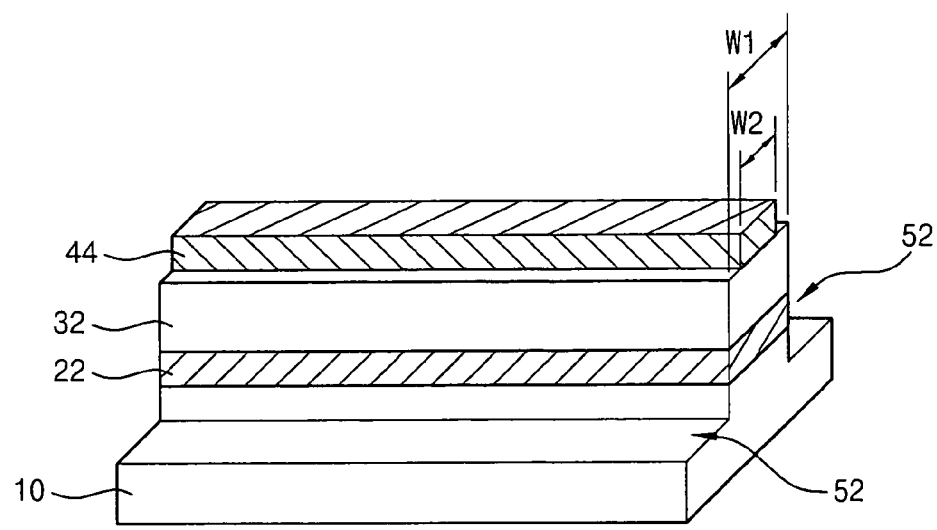
Figure 2E:
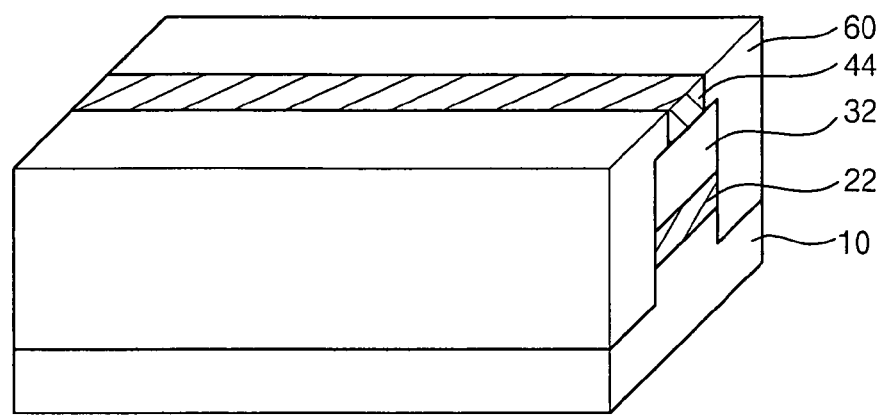
Figure 2F:
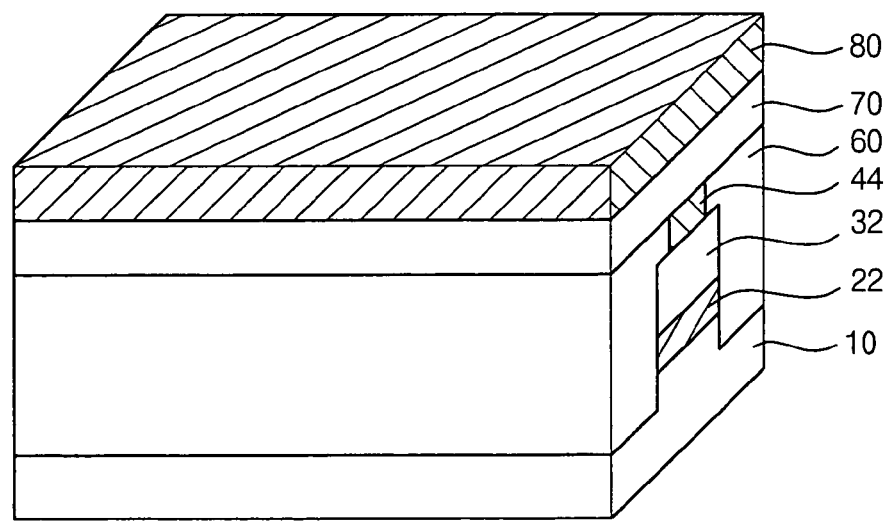
Figure 2G:
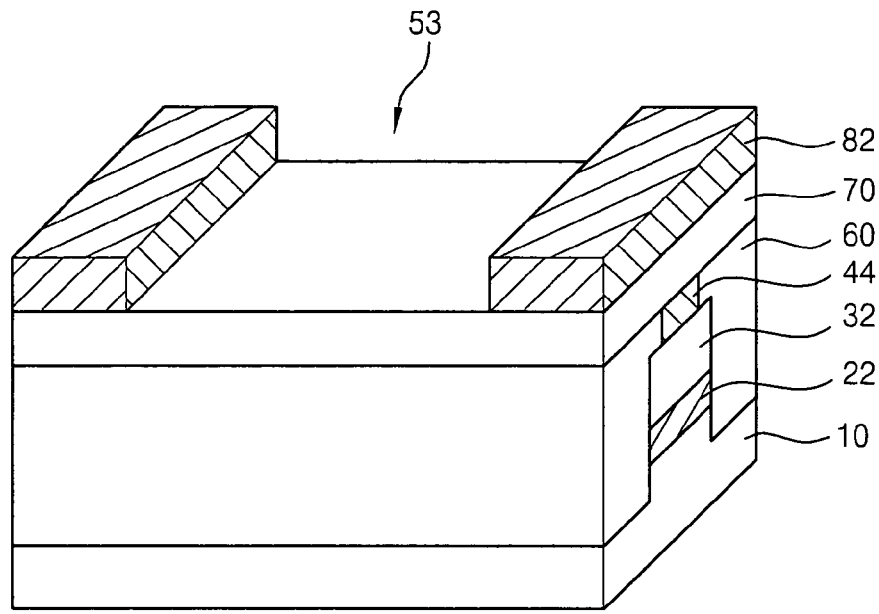
Figure 2H:
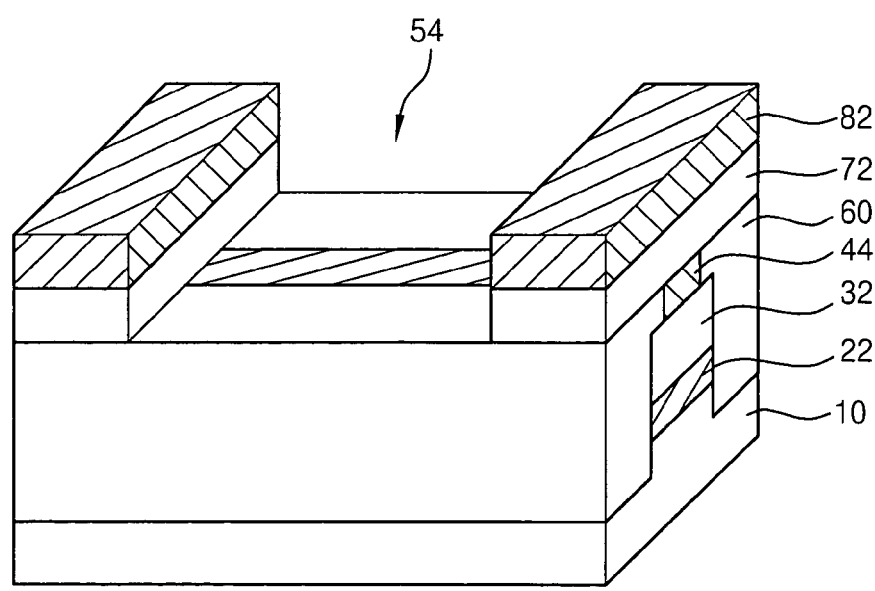
Figure 2I:
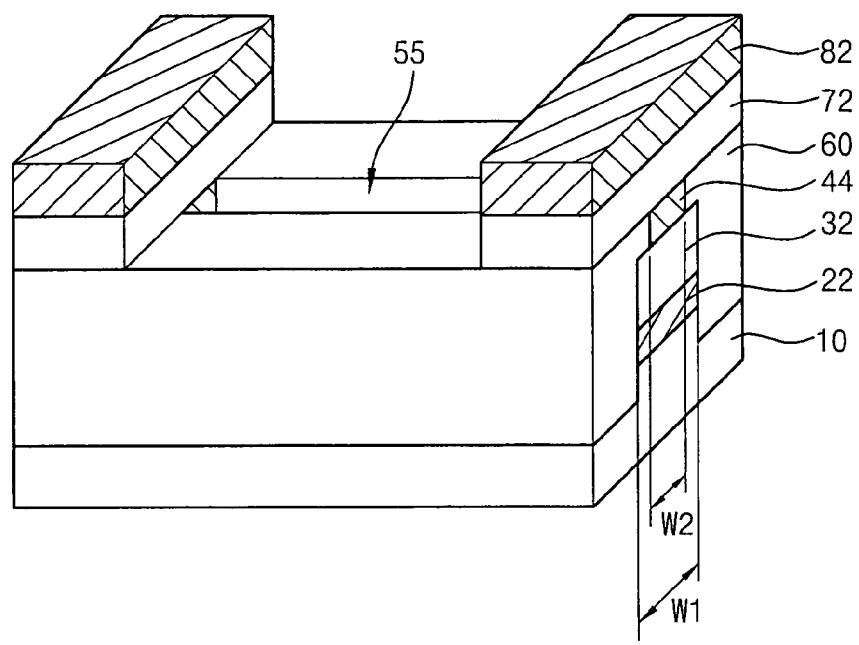
Figure 2J:
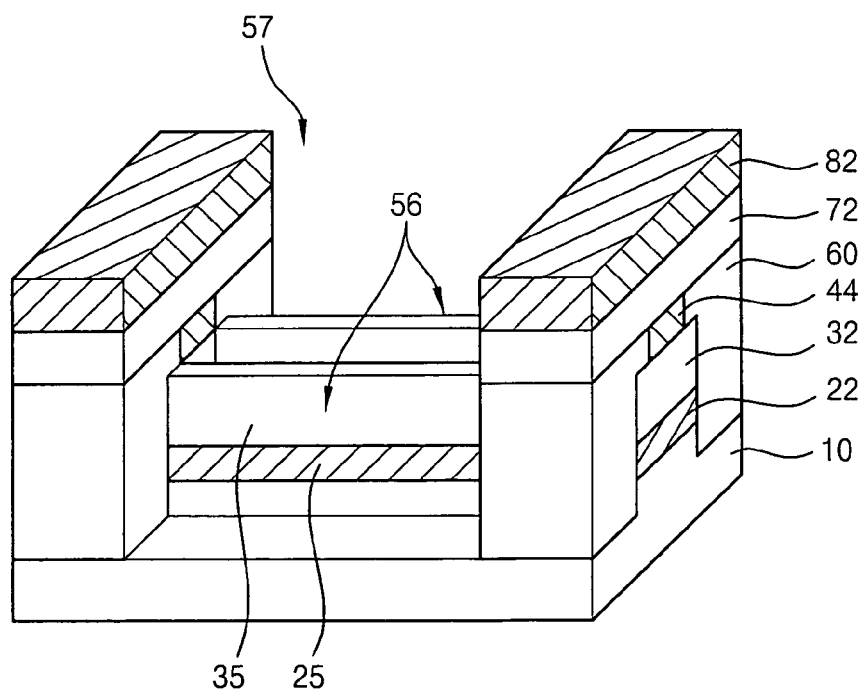
Figure 2K:
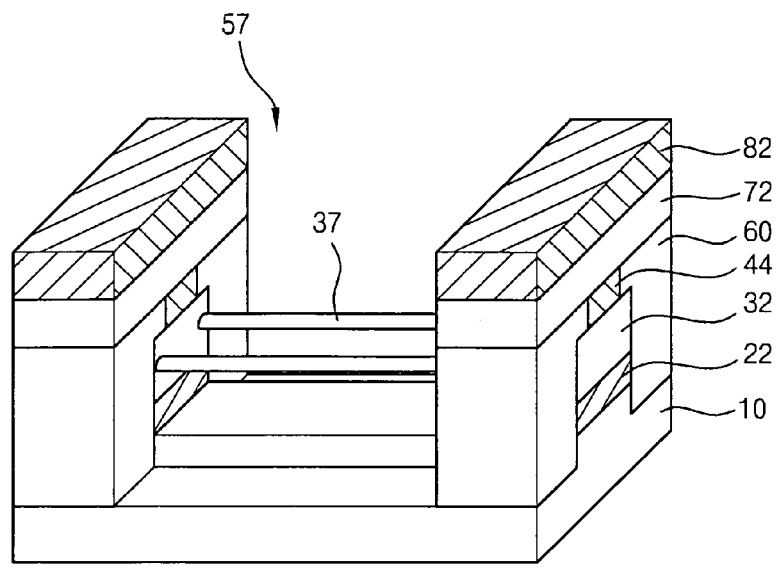
Figure 2L:
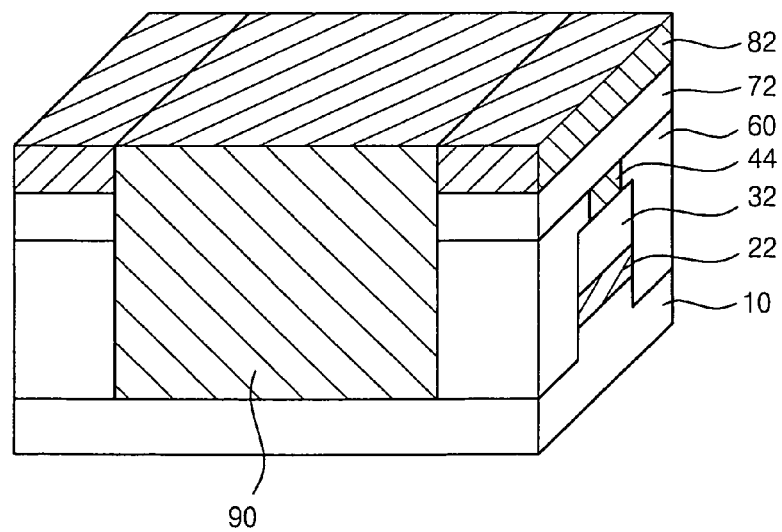
Figure 2M:
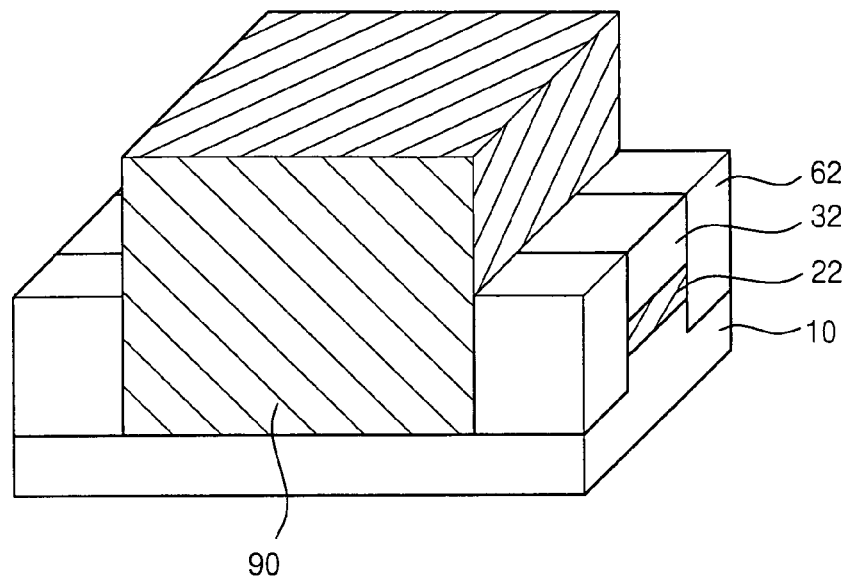
Figure 2N:
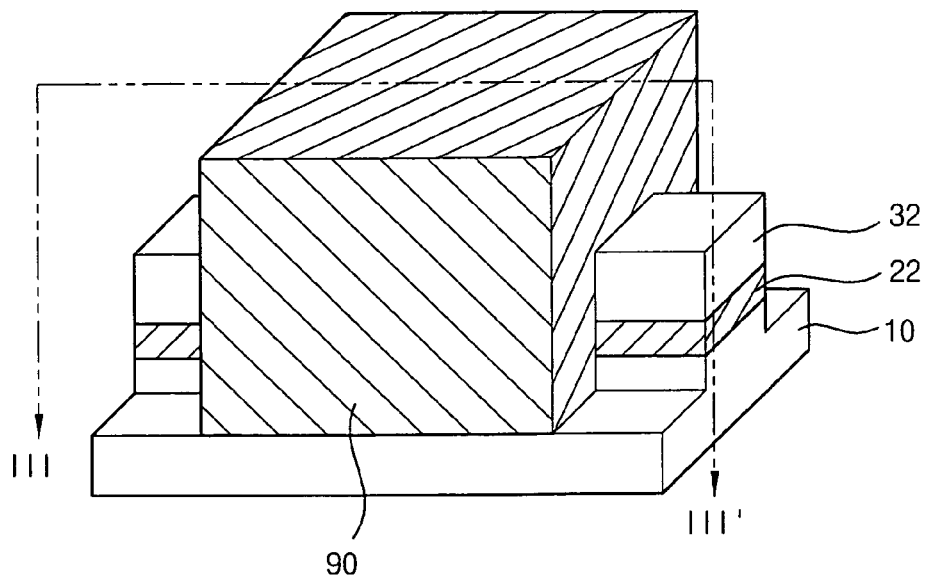
Figure 2O:
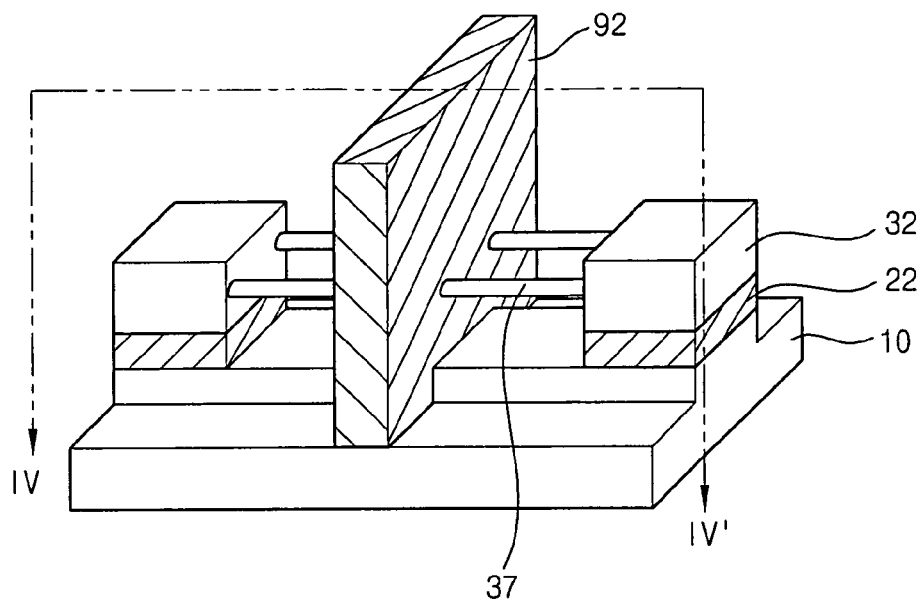
Figure 2P:
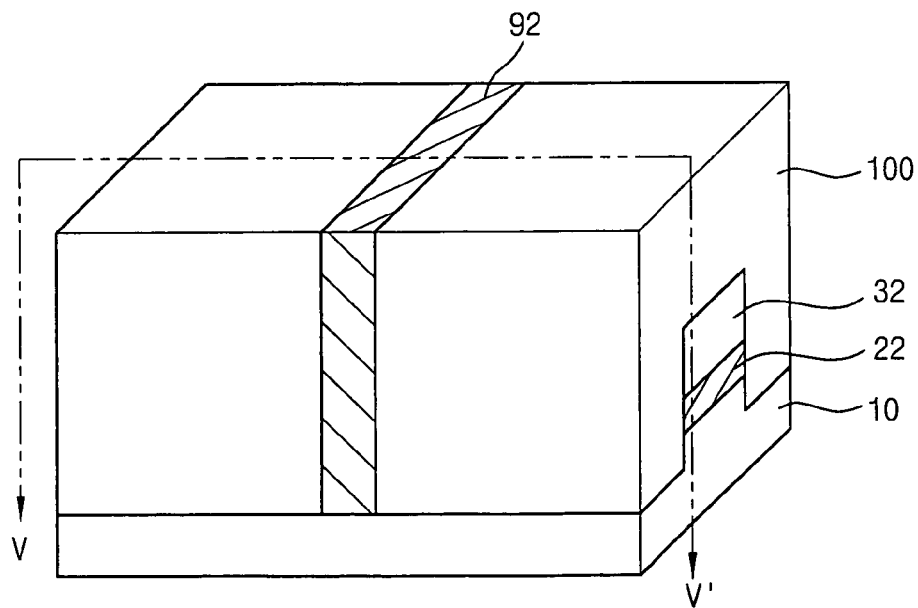
Figure 2Q:
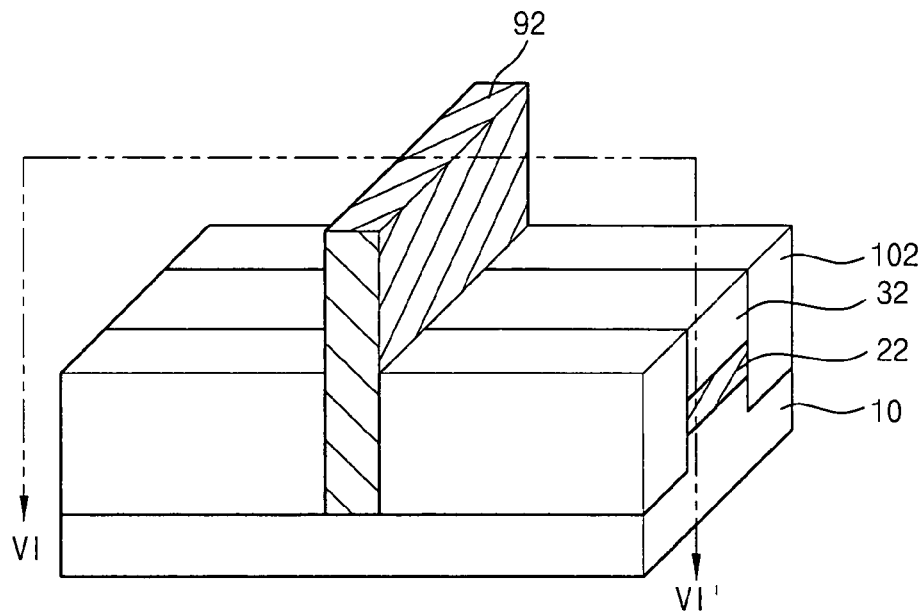
Figure 2R:
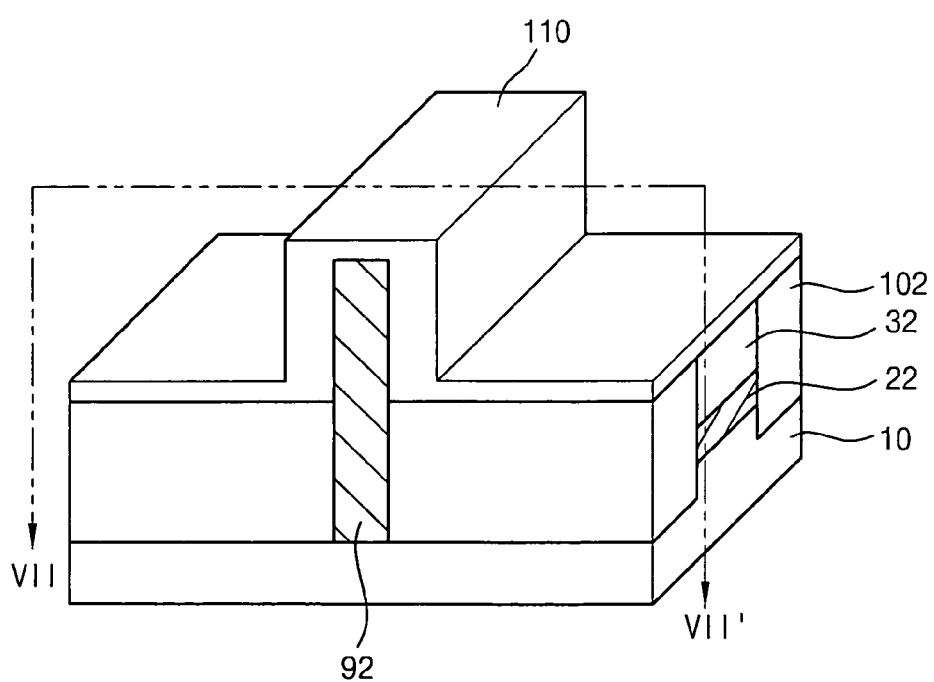
Figure 2S:
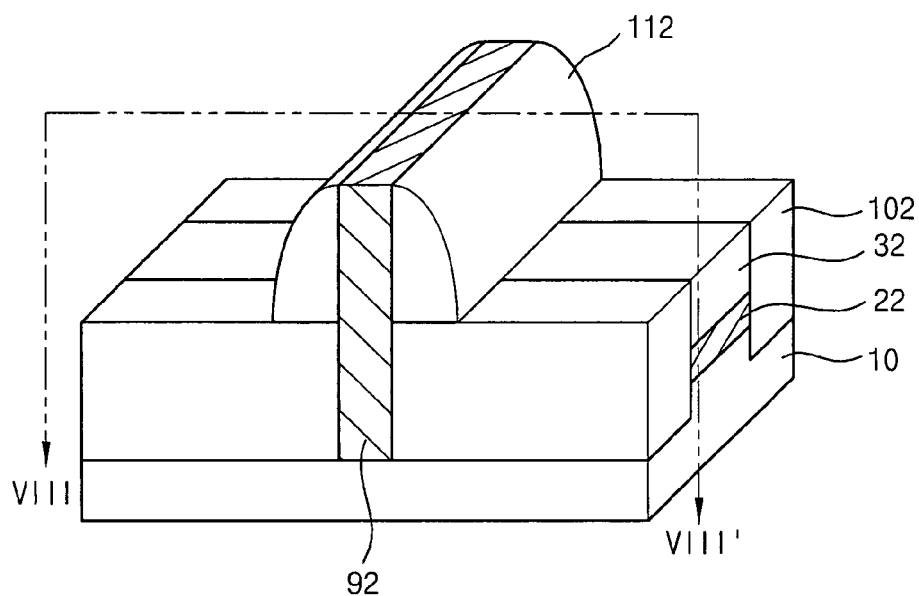
Figure 2T:
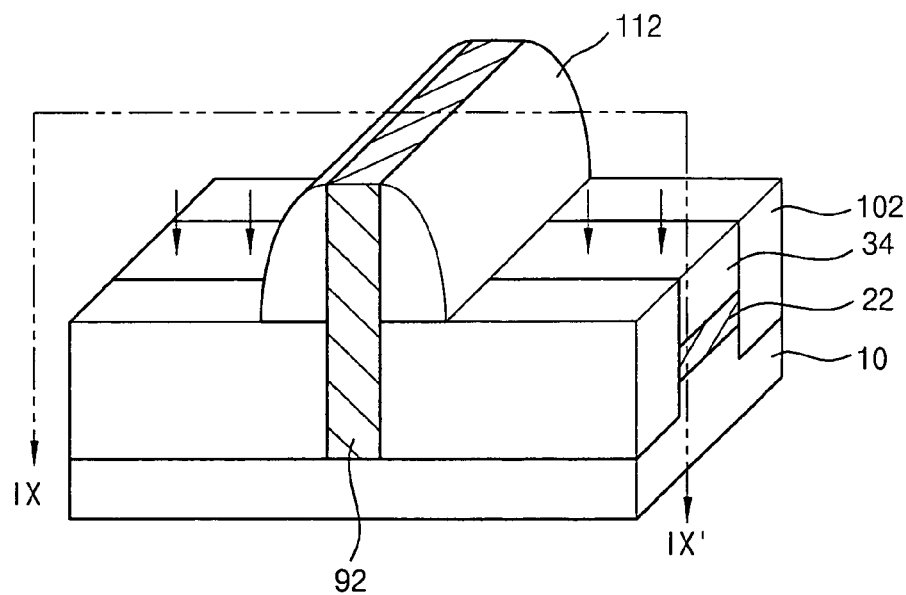

FIGS. 2A to 2T are perspective views illustrating a method of manufacturing a gate-all-around (GAA) type semiconductor device in accordance with example embodiments, and FIGS. 3A to 3G are cross-sectional views illustrating the GAA type semiconductor device taken along a line III-III' to a line IX-IX' in FIGS. 2N to 2T, respectively.

Referring to FIG. 2A, a sacrificial layer 20, a channel layer 30 and a first mask layer 40 may be formed on a semiconductor substrate 10.

The semiconductor substrate 10 and the channel layer 30 may be formed using silicon. In an example embodiment, the semiconductor substrate 10 and the channel layer 30 may be formed using single crystal silicon.

The sacrificial layer 20 may be partially removed in a successive process, and may be formed using a material having an etching selectivity with respect to the channel layer 30. In an example embodiment, the sacrificial layer 20 may be formed using silicon germanium by an epitaxial growth process. The channel layer 30 may be also formed by an epitaxial growth process.

The first mask layer 40 may be formed using a material having an etching selectivity with respect to the channel layer 30, the sacrificial layer 20 and the semiconductor substrate 10, thereby being used as an etching mask in a successive process. For example, the first mask layer 40 may be formed using a nitride such as silicon nitride.

A pad oxide layer (not shown) may be further formed between the channel layer 30 and the first mask layer 40.

Referring to FIG. 2B, the first mask layer 40 may be patterned to extend in the first direction D1. Thus, a plurality of first masks 42 having a first opening 51 therebetween, which partially exposes the channel layer 30, may be formed. The first masks 42 may be formed by a conventional photolithography process using a first photoresist layer (not shown). The plurality of the first masks 42 may be disposed in the second direction D2.

The channel layer 30, the sacrificial layer 20 and the semiconductor substrate 10 may be partially removed by an etching process using the first masks 42 as etching masks so that a second opening 52 partially exposing an upper face of the semiconductor substrate 10 may be formed. Thus, a plurality of preliminary sacrificial layer patterns 22 and a plurality of preliminary channel layer patterns 32 may be formed on the semiconductor substrate 10, as depicted in FIG. 2C. The etching process may include a dry etching process using an etching gas or a wet etching process using an etching solution. If the semiconductor substrate 10, the sacrificial layer 20 and the channel layer 30 are formed using silicon, silicon germanium and silicon, respectively, examples of the etching solution may include a mixed solution containing hydrogen peroxide, hydrogen fluoride and acetic acid, a mixed solution containing ammonium hydroxide, hydrogen peroxide and deionized water, a solution containing peracetic acid, etc.

If the plurality of the first masks 42 is formed, a plurality of the second openings 52 may be disposed in the second direction D2. Hereinafter, an area A (depicted in FIG. 2C) disposed between two of the second openings 52 is illustrated, for simplicity of explanation.

The first mask 42 may be trimmed to form a narrowed mask pattern 44, as depicted in FIG. 2D, so that an upper face of the preliminary channel layer pattern 32 may be partially exposed. That is, the first mask 42, which extends in the first direction D1, may be trimmed so that the upper face of the preliminary channel layer pattern 32 may be partially exposed. If the first mask 42 is formed using a nitride such as silicon nitride, the first mask 42 may be trimmed by a wet etching process using phosphoric acid.

If the preliminary channel layer pattern 32 has a first width W1, the mask pattern 44 may have a second width W2 smaller than the first width W1, and a difference between the first and second widths W1 and W2 may be proportional to a diameter of a nanowire channel successively formed. Thus, if the mask pattern 44 is formed, the first mask 42 may be trimmed in consideration of the diameter of the nanowire channel.

Referring to FIG. 2E, a first insulation layer 60 may be formed on the semiconductor substrate 10 to cover the mask pattern 44, the preliminary channel layer pattern 32 and the preliminary sacrificial layer pattern 22. The first insulation layer 60 may be formed using an oxide such as silicon oxide. The first insulation layer 60 may be removed until a top surface of the mask pattern 44 is exposed. The top surface of the first insulation layer 60 and a top surface of the first insulation layer 60 may be planarized by a chemical mechanical polishing (CMP) process, an etch-back process, or a combination process of CMP and etch-back.

Referring to FIG. 2F, a second insulation layer 70 and a second mask layer 80 may be formed on the first insulation layer 60 and the mask pattern 44.

The second insulation layer 70 may be formed using a material substantially the same as that of the first insulation layer 60 or a material different from that of the first insulation layer 60. The second insulation layer 70 may be formed using a material having an etching selectivity with respect to the second mask layer 80, the mask pattern 44, the preliminary channel layer pattern 32 and the preliminary sacrificial layer pattern 22. In an example embodiment, the second insulation layer 70 may be formed using an oxide.

The second mask layer 80 may be formed using a material substantially the same as that of the first mask layer 40 or a material different from that of the first mask layer 40. The second mask layer 80 may be formed using a material having an etching selectivity with respect to the second insulation layer 70, the mask pattern 44, the preliminary channel layer pattern 32 and the preliminary sacrificial layer pattern 22. In an example embodiment, the second mask layer 80 may be formed using a nitride.

The second mask layer 80 may be patterned to extend in the second direction D2. Thus, a second mask 82, as depicted in FIG. 2G, may have a third opening 53 therethrough, which partially exposes the second insulation layer 70. The second mask 82 may be formed by a conventional photolithography process using a second photoresist layer (not shown).

A portion of the second insulation layer 70 exposed by the third opening 53 may be removed by an etching process using the second mask 82 as an etching mask to form a fourth opening 54 partially exposing the mask pattern 44 and the first insulation layer 60, as depicted in FIG. 2H. Thus, a second insulation layer pattern 72 and the second mask 82 may be formed on the mask pattern 44 and the first insulation layer 60. The etching process may include a dry etching process using an etching gas or a wet etching process using an etching solution. If the second insulation layer 70 is formed using an oxide such as silicon oxide, the etching solution may include a mixed solution containing nitric acid and hydrofluoric acid.

Referring to FIG. 2I, a portion of the mask pattern 44 exposed by a fourth opening 54 may be removed by an etching process using the second mask 82, the second insulation layer pattern 72 and a portion of the first insulation layer 60 which may be exposed by the fourth opening 54 as etching masks to form a fifth opening 55 which may partially expose the preliminary channel layer pattern 32. The etching process may include a dry etching process using an etching gas. A portion of the preliminary channel layer pattern 32 may be exposed by the fifth opening 55 and a portion of the preliminary sacrificial layer pattern 22 may be disposed beneath the exposed portion of the preliminary channel layer pattern 32 which may be removed by a dry etching process.

Portions of the mask pattern 44, the preliminary channel layer pattern 32 and the preliminary sacrificial layer pattern 22, which may be disposed beneath or under the second mask 82 and the second insulation layer pattern 72, may not be exposed by the fifth opening 55 so that the portions may not be removed in the dry etching process, to thereby remain on the semiconductor substrate 10.

As illustrated in FIG. 2I, the first width W1 of the preliminary channel layer pattern 32 may be greater than the second width W2 of the mask pattern 44 so that portions of the preliminary channel layer pattern 32 and the preliminary sacrificial layer pattern 22, which correspond to the second width W2, may be removed, but other portions of the preliminary channel layer pattern 32 and the preliminary sacrificial layer pattern 22 may remain. Thus, a sixth opening 56 (see FIG. 2J) exposing a portion of the semiconductor substrate 10 may be formed, and a sacrificial layer pattern 25 and a channel layer pattern 35 may be formed on another portion of the semiconductor substrate 10, which may not be exposed by the sixth opening 56.

Referring to FIG. 2J, a portion of the first insulation layer 60 exposed by the fourth opening 54 may be removed to form a seventh opening 57 having the channel layer pattern 35 and the sacrificial layer pattern 25 therein. The seventh opening 57 may be formed by a dry etching process using an etching gas or by a wet etching process using an etching solution. If the first insulation layer 60 is formed using an oxide such as silicon oxide, the etching solution may include a mixed solution containing nitric acid and hydrofluoric acid.

The sacrificial layer pattern 25 may be removed by an etching process so that the channel layer pattern 35 may be transformed to a preliminary nanowire channel 37, as depicted in FIG. 2K. The sacrificial layer pattern 25 may be removed by a wet etching process using an etching solution or an isotropic plasma etching process using an etching gas. The etching solution may include a solution having an etching selectivity between silicon germanium and silicon and between silicon germanium and oxide. The isotropic plasma etching process may be performed under an atmosphere of mixed gas including hydrogen bromide and oxygen.

The preliminary nanowire channel 37 may have a shape of a square pillar instead of a circular cylinder or an elliptic cylindrical. If the preliminary nanowire channel 37 has a square pillar shape, an annealing process may be performed on the preliminary nanowire channel 37 under a hydrogen atmosphere so that an edge portion of the preliminary nanowire channel 37 may be rounded. Particularly, the annealing process may be performed at a temperature of about 800 to about 1000° C. under a pressure below about 10 Torr for about 100 to about 1000 seconds. If the edge portion of the preliminary nanowire channel 37 is rounded by the annealing process, an area surrounded covered by a gate electrode 92 (see FIG. 2O) may be increased, such that a short channel effect may be reduced and characteristics of a gate insulation layer may be improved.

The gate insulation layer including silicon oxide may be further formed by a heat treatment process on the preliminary nanowire channel 37, the preliminary channel layer pattern 32, the preliminary sacrificial layer pattern 22 and the semiconductor substrate 10, all of which include silicon therein.

Referring to FIG. 2L, a gate conductive layer 90 may be formed on the semiconductor substrate 10 to cover the seventh opening 57. The gate conductive layer 90 may be formed using a metal nitride such as titanium nitride, tantalum nitride, etc., a metal such as titanium, tantalum, etc., or polysilicon. In an example embodiment, the gate conductive layer 90 may be formed using titanium nitride.

The second mask 82, the second insulation layer pattern 72 and the mask pattern 44 may be removed, as depicted in FIG. 2M. A portion of the first insulation layer 60 may be removed to form a first insulation layer pattern 62. The second mask 82, the second insulation layer pattern 72, the mask pattern 44 and the portion of the first insulation layer 60 may be removed by a wet etching process using an etching solution or a dry etching process using an etching gas.

Figure 3A:
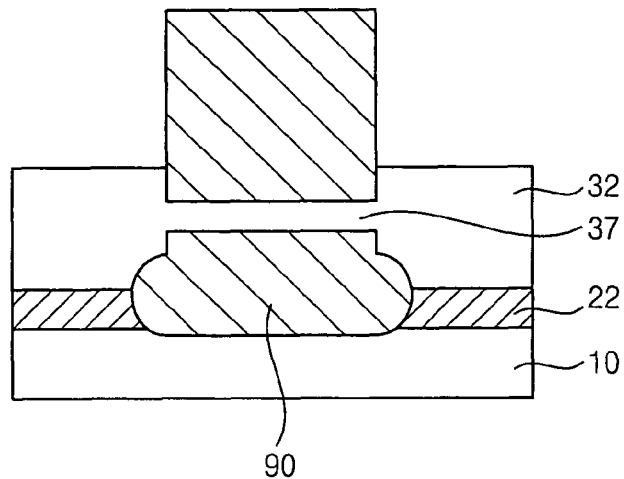
FIGS. 3A to 3G are cross-sectional views illustrating a GAA type semiconductor device taken along a line to a line IX-IX' in FIGS. 2N to 2T, respectively.

The first insulation layer pattern 62 may be removed by an etching process, as depicted in FIGS. 2N and 3A. In FIG. 3A, a first portion of the gate conductive layer 90 under the preliminary nanowire channel 37 has a width greater than that of a second portion of the gate conductive layer 90 over the preliminary nanowire channel 37. Additionally, a top surface of the semiconductor substrate 10 under the gate conductive layer 90 may be partially removed. The above width difference between the first and second portions of the gate conductive layer 90 and the above partial removal of the top surface of the semiconductor substrate 10 may be generated because of an excessive etching of the sacrificial layer pattern 25 (as depicted in FIG. 2J) and the semiconductor substrate 10 if the sacrificial layer pattern 25 is removed by an etching process. The excessive etching may be frequently generated in a wet etching process. However, the excessive etching may not be generated much in an isotropic plasma etching process.

Figure 3B:
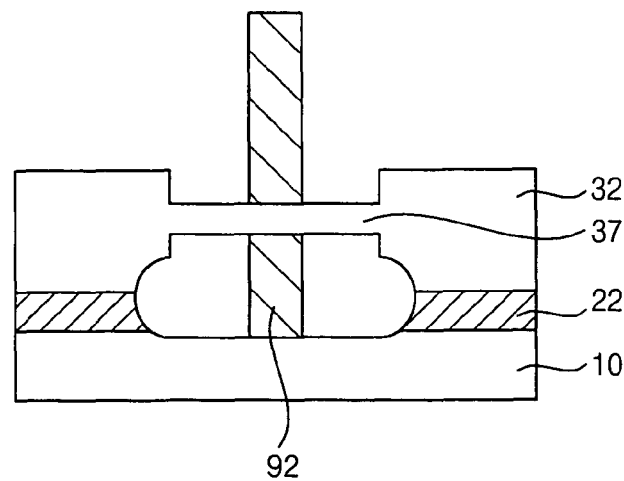

The gate conductive layer 90 may be partially removed by a stripping process and/or an ashing process, as depicted in FIGS. 2O and 3B. Alternatively, the gate conductive layer 90 may be partially removed by a wet etching process. Thus, the gate conductive layer 90 may be transformed to a gate electrode 92 having a size smaller than that of the gate conductive layer 90. In an example embodiment, the stripping process may be performed using polyacrylonitrile (PAN).

Accordingly, a portion of the preliminary nanowire channel 37 in the gate conductive layer 90 may be exposed. Additionally, the gate electrode 92 and the remaining preliminary channel layer pattern 32 do not contact each other.

Figure 3C:
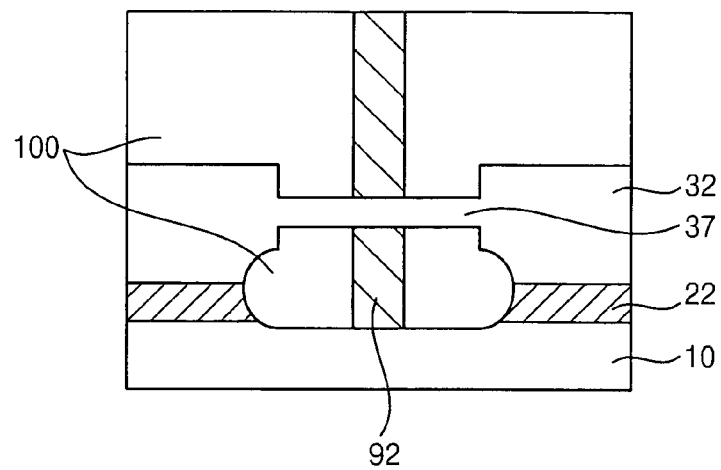

Referring to FIGS. 2P and 3C, a third insulation layer 100 may be formed on the semiconductor substrate 10 to cover the gate electrode 92, the preliminary nanowire channel 37, the preliminary channel layer pattern 32 and the preliminary sacrificial layer pattern 22. The third insulation layer 100 may be formed using a material substantially the same as or different from those of the first and second insulation layers 60 and 70. That is, the third insulation layer 100 may be formed using an oxide such as silicon oxide, an HDP oxide, etc. The third insulation layer 100 may be partially removed until a top surface of the gate electrode 92 may be exposed, and the top surface of the gate electrode and a top surface of the third insulation layer 100 may be planarized.

The third insulation layer 100, as shown in FIG. 3C, may be also formed between the gate electrode 92 and the preliminary channel layer pattern 32. Thus, the gate electrode 92 and the preliminary channel layer pattern 32 may not contact each other.

Figure 3D:
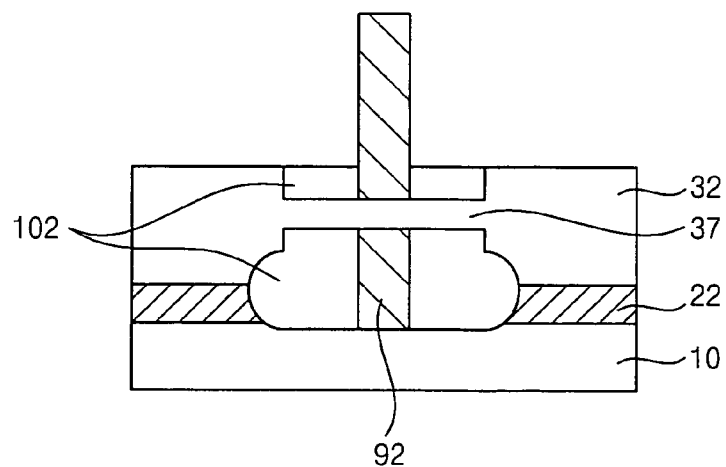

The third insulation layer 100 may be partially removed until an upper face of the preliminary channel layer pattern 32 may be exposed to form a third insulation layer pattern 102, as depicted in FIGS. 2Q and 3D. Thus, an upper portion of the gate electrode 92 may be exposed. The third insulation layer pattern 102 may serve as an isolation layer. Additionally, as illustrated above, the third insulation layer pattern 102 may be disposed between the gate electrode 92 and the preliminary channel layer pattern 32, so that the gate electrode 92 and the preliminary channel layer pattern 32 may not contact each other.

Figure 3E:
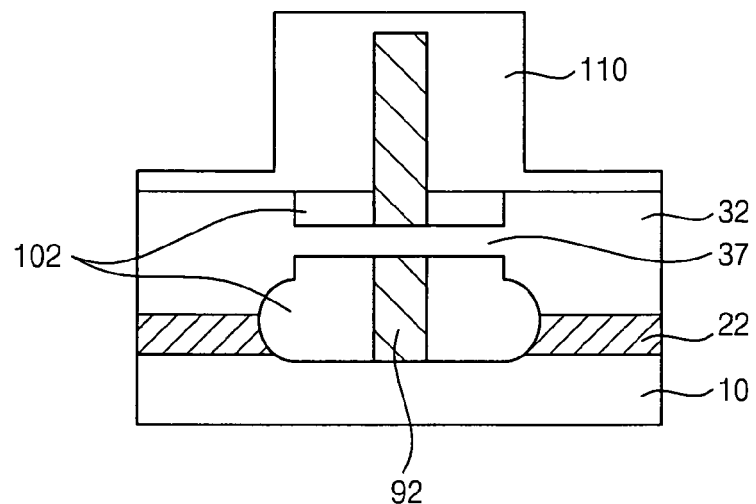

Referring to FIGS. 2R and 3E, a fourth insulation layer 110 may be formed on the preliminary channel layer pattern 32, the third insulation layer pattern 102 and the exposed upper portion of the gate electrode 92. The fourth insulation layer 110 may be formed using a material substantially the same as or different from those of the first to third insulation layers 60, 70 and 100. That is, the fourth insulation layer 110 may be formed using an oxide such as silicon oxide, an HDP oxide, etc. or a nitride such as silicon nitride. In an example embodiment, the fourth insulation layer 110 may be formed using silicon nitride.

Figure 3F:
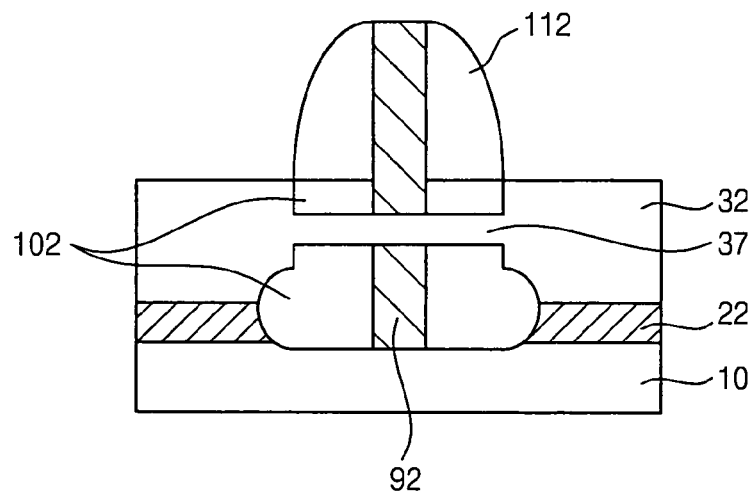

Referring to FIGS. 2S and 3F, the fourth insulation layer 110 may be partially removed to form a spacer 112 on a sidewall of the gate electrode 92, the preliminary channel layer pattern 32 and the third insulation layer pattern 102. In an example embodiment, the fourth insulation layer 110 may be partially removed by an etch-back process.

The spacer 112 may be formed to have a width greater than a length of the preliminary nanowire channel 37 as shown in FIG. 3F. Thus, impurities may not be directly implanted into the preliminary nanowire channel 37 in a successive process.

Figure 3G:
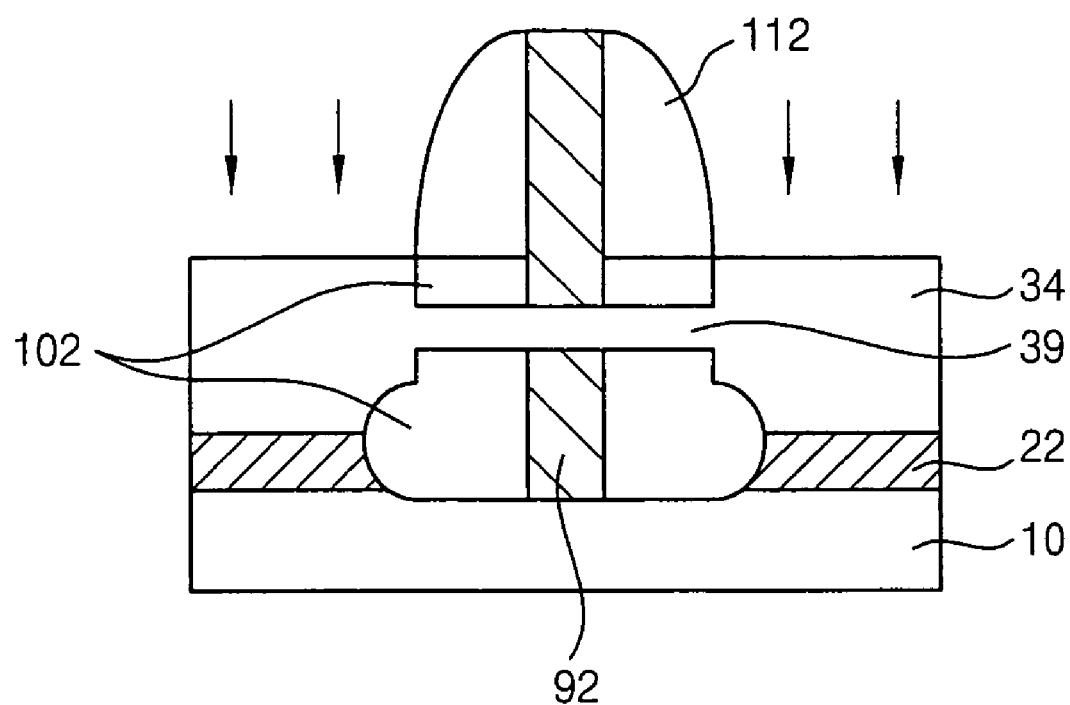

Impurities may be implanted into the preliminary channel layer pattern 32 to form a source/drain layer, as depicted in FIGS. 2T and 3G. The impurities may include p-type impurities or n-type impurities according to a type of a transistor. If concentrations of the impurities are increased, some of the impurities implanted into the preliminary channel layer pattern 32 move to the preliminary nanowire channel 37. Thus, the preliminary nanowire channel 37 may be converted into a nanowire channel 39 doped with impurities. As mentioned above, the spacer 112 prevents the impurities from being implanted into the preliminary nanowire channel 37 so that the preliminary nanowire channel 37 may not be damaged.

The GAA type semiconductor device in which the gate electrode 92 surrounds the nanowire channel 39 may be completed by the above processes.

According to some example embodiments, in a gate-all-around (GAA) type semiconductor device having a nanowire channel, a size of a gate electrode may be reduced and an insulation layer pattern may be formed between the gate electrode and a source/drain layer. Thus, an area at which the gate electrode makes contact with the source/drain layer may be reduced so that a gate induced drain leakage (GIDL) may be reduced. Additionally, a gate leakage current may be reduced because a distance between the gate electrode and the source/drain layer may be increased. Furthermore, the gate electrode has a size smaller than that of a conventional gate electrode so that the GAA type semiconductor device may advantageously have a greater integration degree.

The foregoing is illustrative of example embodiments and are not to be construed as limiting thereof. Although a few example embodiments have been described, those skilled in the art will readily appreciate that many modifications are possible without materially departing from the novel teachings and advantages. Accordingly, all such modifications may be intended to be included within the scope of the example embodiments as defined in the claims. In the claims, means-plus-function clauses may be intended to cover the structures described herein as performing the recited function and not only structural equivalents but also equivalent structures. Therefore, it is to be understood that the foregoing may be illustrative of example embodiment and may not to be construed as limited to the specific example embodiments disclosed, and that modifications to the disclosed example embodiments, as well as other example embodiments, are intended to be included within the scope of the appended claims. The example embodiments may be defined by the following claims, with equivalents of the claims to be included therein.

What is claimed is:

1. A gate-all-around type semiconductor device comprising:
 a source layer and a drain layer disposed at a predetermined distance apart from each other in a first direction on a semiconductor substrate;
 a nanowire channel connecting the source layer and the drain layer;
 a gate electrode extending in a second direction substantially perpendicular to the first direction, wherein the gate electrode has a height in a third direction substantially perpendicular to the first and second directions and partially surrounds the nanowire channel; and
 an insulation layer pattern between the gate electrode and the source/drain layers on the semiconductor substrate to separate the gate electrode from the source/drain layers in the first direction, the insulation layer pattern covering the nanowire channel and a portion of the gate electrode,
 wherein the insulation layer pattern surrounds the nanowire channel at both sides of the gate electrode.

2. The semiconductor device of claim 1, wherein the nanowire channel has a circular cylindrical shape or an elliptic cylindrical shape extending in the first direction.

3. The semiconductor device of claim 1, wherein the insulation layer pattern contacts the source/drain layers.

4. The semiconductor device of claim 1, further comprising a gate insulation layer interposed between the nanowire channel and the gate electrode.

5. The semiconductor device of claim 1, further comprising a sacrificial layer pattern formed between the semiconductor substrate and the source/drain layers.

6. The semiconductor device of claim 5, wherein the semiconductor substrate comprises single crystal silicon, the source layer and the drain layer comprises doped single crystal silicon, and the sacrificial layer pattern comprises silicon germanium.

7. The semiconductor device of claim 1, wherein the gate electrode is selected from the group consisting of a metal, a metal nitride and polysilicon.

8. The semiconductor device of claim 7, wherein the gate electrode is titanium nitride.

9. The semiconductor device of claim 1, wherein the nanowire channel and the source layer and drain layer are all active regions.

10. The semiconductor device of claim 9, wherein the insulation layer pattern serves as an isolation layer for isolating the active regions from each other.

11. The semiconductor device of claim 1, further comprising a gate insulation layer surrounding the nanowire channel.

12. The semiconductor device of claim 11, wherein the gate insulation layer comprises silicon oxide formed by a heat treatment.

13. The semiconductor device of claim 1, further comprising:
 a spacer on a sidewall of the gate electrode to be used as an impurity implantation mask to form the source/drain layers.

14. The semiconductor device of claim 13, wherein the spacer protrudes from the source/drain layers and the insulation layer pattern.

15. The semiconductor device of claim 13, wherein the spacer covers the sidewall of the gate electrode, a portion of the source/drain layers and a portion of the insulation layer pattern.

16. The semiconductor device of claim 13, wherein the insulation layer pattern and the spacer comprise substantially the same insulation material.

* * * * *